United States Patent
Kosmowski

(10) Patent No.: US 9,050,664 B1
(45) Date of Patent: Jun. 9, 2015

(54) LOW MASS, LOW PROFILE, FORCE BALANCED Z-AXIS DRILLING APPARATUS WITH IMPROVED MACHINE DYNAMICS

(71) Applicant: Wojciech B. Kosmowski, San Juan Capristrano, CA (US)

(72) Inventor: Wojciech B. Kosmowski, San Juan Capristrano, CA (US)

(73) Assignee: Interdyne Systems Inc, Grand Cayman (KY)

( * ) Notice: Subject to any disclaimer, the term of this patent is extended or adjusted under 35 U.S.C. 154(b) by 0 days.

(21) Appl. No.: 14/303,998

(22) Filed: Jun. 13, 2014

(51) Int. Cl.
| | |
|---|---|
| *B23B 39/00* | (2006.01) |
| *B23B 47/26* | (2006.01) |
| *B23B 41/14* | (2006.01) |
| *B23Q 5/32* | (2006.01) |

(52) U.S. Cl.
CPC .............. *B23B 47/26* (2013.01); *B23B 41/14* (2013.01); *B23Q 5/32* (2013.01); *B23B 2220/36* (2013.01); *Y10T 408/675* (2015.01); *Y10T 408/5653* (2015.01); *Y10T 408/5623* (2015.01); *Y10T 408/5647* (2015.01)

(58) Field of Classification Search
USPC ............. 408/95, 111, 98, 129, 102, 112, 124, 408/51, 52, 97; 409/218, 178
See application file for complete search history.

(56) References Cited

U.S. PATENT DOCUMENTS

| | | | | | |
|---|---|---|---|---|---|
| 4,443,141 | A | * | 4/1984 | Kosmowski | 409/163 |
| 4,813,825 | A | * | 3/1989 | Kosmowski | 408/98 |
| 4,932,117 | A | * | 6/1990 | Reed et al. | 483/13 |
| 5,108,236 | A | * | 4/1992 | Arai et al. | 409/163 |
| 5,997,223 | A | * | 12/1999 | Kosmowski | 408/124 |
| 7,252,462 | B2 | * | 8/2007 | Suzuki et al. | 408/95 |

* cited by examiner

*Primary Examiner* — Eric A Gates
*Assistant Examiner* — Paul M Janeski
(74) *Attorney, Agent, or Firm* — Mark S Hubert

(57) ABSTRACT

An improved lightweight z-axis (vertical) drilling apparatus for a commercial PCB drilling systems that uses a pair of unitary z-axis movement guides that integrate the vertical, guided movement of the linear actuator, spindle and pressure foot of a PCB drilling apparatus. The linear actuator is positioned directly above and coupled to the spindle, and the unitary z-axis movement guides situated such that the such that the center of mass of all of the drilling assembly's moving components is collinear with the axis of rotation of the motor and spindle. The combination of these improvements allows for faster drilling times, shorter drilling cycles, less drill bit wander, slower drill bit dulling and less drill bit breakage.

16 Claims, 9 Drawing Sheets

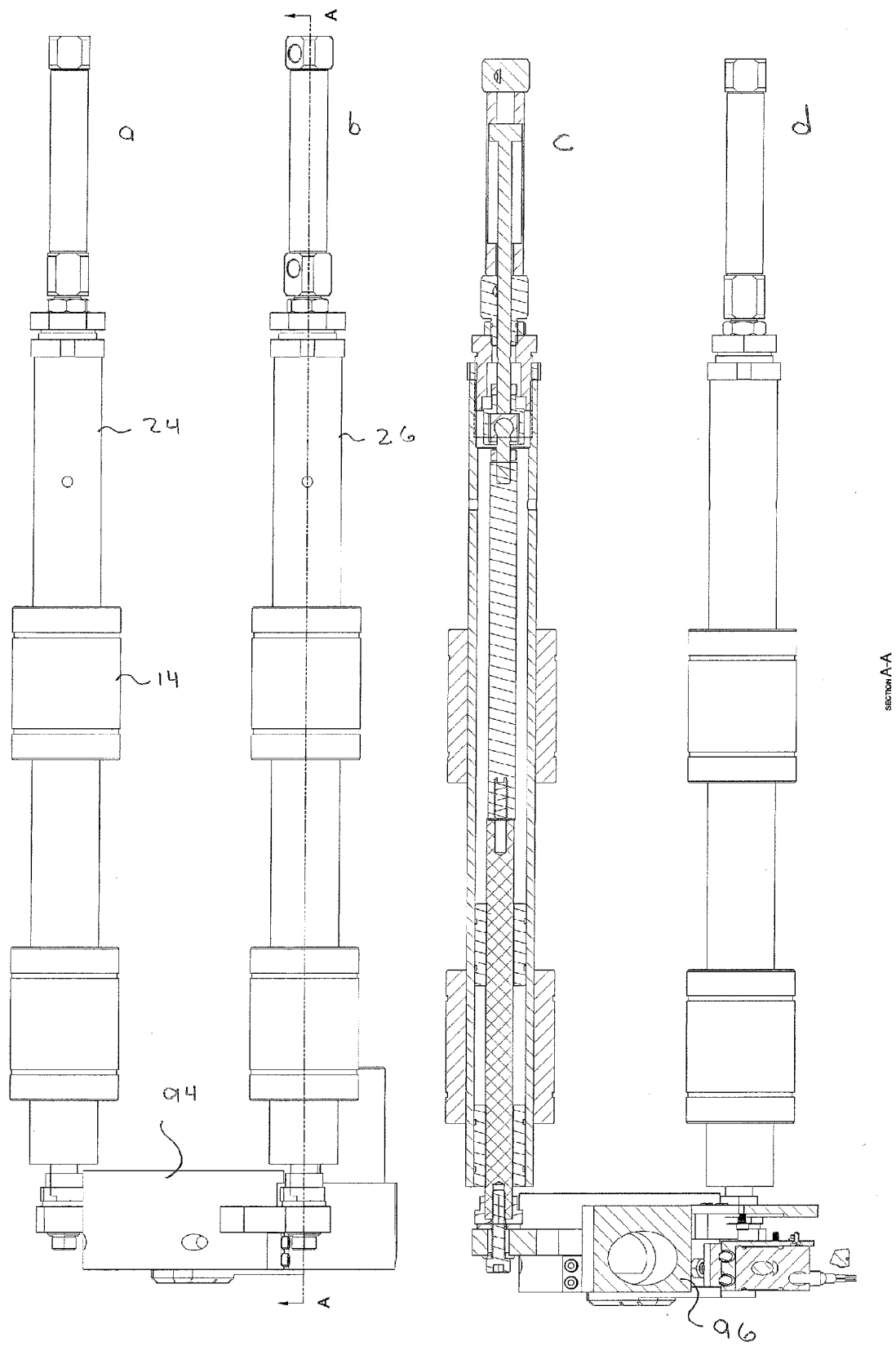

LOW MASS, LOW PROFILE, FORCE BALANCED Z-AXIS DRILLING APPARATUS WITH IMPROVED MACHINE DYNAMICS

BACKGROUND OF THE INVENTION

The present invention involves a novel design for a printed circuit board (PCB) substrate drilling apparatus that greatly increases the speed and accuracy in repetitive commercial drilling as well as minimizing the wander of the drill bits, the breakage of the drill bits and extending the life of the drill bits. This is accomplished by improving the machine dynamics.

There is a huge industry developed around the demand to drill multiple, spaced holes (through or non-through) in substrates such as electronic wafers, thin film electronics, organic packaging substrates or the like. Large, commercial PCB drilling systems quickly position and operate these drilling apparatuses. These holes or patterned drillings may be used for electrical connections, filtration, cytology, bioassays, chemotoxis, or particle monitoring and have diameters that commonly lie in the micron range. Not only must the holes be identical to each other in diameter but also must be placed at precise locations and with the right geometry with respect to the substrate or adjacent holes.

Generally, such drilling systems see movement in all three axes. There is simultaneous movement in the x and y axes (horizontal plane) by a linear beam style, y-axis wing and x-axis carriage that places a drilling apparatus precisely over a substrate to be drilled. A z-axis (vertical axis) drilling apparatus mounted on the x-axis carriage then momentarily plunges a high speed revolving drill bit into the substrate to drill a hole, once the y-axis wing and x-axis carriage reaches the specified position window (the precise location within set dimensional tolerances), and then the cycle repeats itself. There are usually multiple carriages on the wing, each with their own drilling apparatus to enable simultaneous drilling of a plethora of substrates. The proper positioning of the drilling apparatus is accomplished using a set of linear scales (optical or magnetic positioning sensors.) This positioning prior to drilling occurs extremely rapidly by computer control, cycling up to thousands of times per minute.

Pursuant to Newton's third law of motion, each of these three positioning or drilling movements creates reactionary forces in the structure of the PCB substrate drilling system. The size of these reactionary forces is directly related to the magnitude of the moving mass of the wing, carriage and the drilling apparatus. Generally commercial machines try to make the stationary mass to moving mass ratio of their systems greater than 10:1. In the system that incorporates this present invention, this ratio exceeds 22:1.

The settling or lag time for the linear scales to report that the drilling apparatus is positioned within the acceptable tolerance ranges (positioning window) to initiate the plunge drilling, is slowed by the reactionary forces. Thus, the magnitude of the moving mass, slows the positioning process and adds slight inaccuracies in the z-axis drilling apparatus's positioning. This limits the productivity of the PCB drilling system.

All the prior art PCB substrate drilling systems incorporate specialized designs to minimize these reactionary forces. The state of this art is highly developed and further advances in this area are slow. The secret to higher output lies in reducing the mass of the moving components, and eliminating any unbalanced forces.

Henceforth, a PCB substrate drilling system with improved accuracy and speed, faster and deeper drilling depth (increased PCB substrate stack heights), longer drill bit life, less drill bit breakage and a higher machine throughput would fulfill a long felt need in the substrate drilling and surface patterning industry. This new invention utilizes a low mass, low profile, dynamic force balanced z-axis drilling apparatus to reduce reactionary forces and combines known and new technologies in a unique and novel configuration to overcome the aforementioned problems of the prior art PCB drilling systems.

SUMMARY OF THE INVENTION

The present invention, which will be described subsequently in greater detail, relates to a drilling apparatus for use on a PCB substrate drilling system, adapted to enable a higher throughput. More particularly, to a PCB substrate drilling apparatus that reduces any reactionary forces from the x-axis and y-axis positioning because of its lighter mass, and also reduces any operational movement of the drilling apparatus by its dynamic balanced design resulting in a zero moment arm operation. It has many of the advantages mentioned heretofore and many novel features which are not anticipated, rendered obvious, suggested, or even implied by any of the prior art, either alone or in any combination thereof.

In accordance with the invention, an object of the present invention is to provide an improved PCB substrate drilling apparatus that minimizes or eliminates all reactionary force effects from the positioning and drilling functions that are created by the PCB drilling machine's moving components.

It is another object of this invention to provide an improved PCB substrate drilling apparatus of a reduced mass (preferably less than 4.5 kilograms) and a reduced height profile with a fully dynamic balanced operation.

It is another object of this invention to provide an improved PCB substrate drilling apparatus having extreme stiffness in the z-axis because the spindle is directly attached to the linear actuator without any linkages or joints there between. This eliminates unwanted resonances.

It is another object of this invention to provide an improved PCB substrate drilling apparatus that has no thermal expansion problems between the various components of the drilling apparatus that would affect the position of the drill bit point.

It is a further object of this invention to provide a PCB substrate drilling apparatus that has a unitary linear actuator guide, spindle guide and pressure foot guide.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements. Other objects, features and aspects of the present invention are discussed in greater detail below.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims appended hereto.

BRIEF DESCRIPTION OF THE DRAWINGS

FIGS. 9a-d are views of the guide rod assembly with the pressure foot attached.

DETAILED DESCRIPTION

Figure 1:
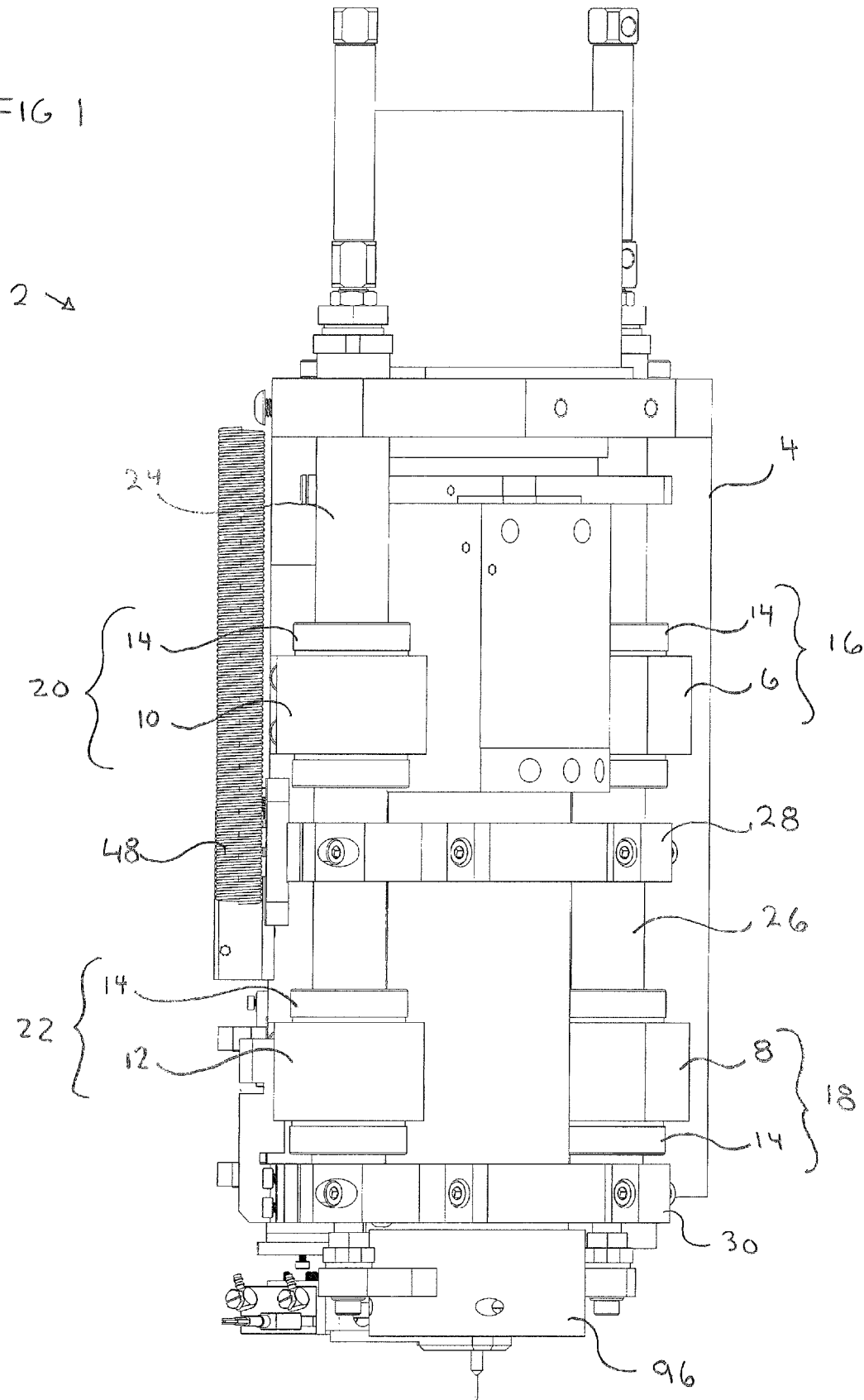
FIG. 1 is a front side view of the z-axis drilling apparatus showing the general arrangement of all components.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Specifically, the drilling apparatus is not limited to use in the z-axis, with PCB drilling systems or even with high speed air bearing motors. Use with routers, component insertion devices, glue dispensers for PCB board fabrication or any other functions requiring high speed operation and precise positioning, may also be envisioned. Also, it is to be understood that the phraseology and terminology employed herein are for the purpose of descriptions and should not be regarded as limiting. As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Prior art PCB substrate drilling systems rely on the use of a massive, heavy machine bases to minimize the reactionary forces inherent in the movement of the drilling apparatus in the x-y plane (horizontal plane.) It is these reactionary forces that serve to limit the speed and accuracy at which these systems can function. When drilling micro holes of 100 microns or less in diameter at a rates higher than 20 plus cycles per second, the positioning accelerations increase to meet the point to point positioning commands and the reactionary force disturbances that are injected into the heavy machine base cause the settling time at the end of each positioning to become longer. Thus any move time reduction gained by the improved acceleration of the drilling apparatus is negated by the increase in settling times. Only with new designs of the drilling apparatus that utilizes lighter moving masses and a more dynamically balanced drilling apparatus so as to reduce settling times can throughout increase. This approach attacks the problem at the root cause (creating smaller reactionary forces in the first place.) If the moving mass of the PCB drilling system can be substantially reduced, its overall height reduced, its stiffness increased and the linkages between the motor and spindle eliminated the settling windows of the positioning sensors in the x and y axes may be reduced such that drill bit wander, drill bit dulling and drill bit breakage are greatly reduced as the drill bit plunges into the planar face of the PCB substrate precisely perpendicular with constant velocity.

The prior art commercial PCB drilling systems utilize mechanical linkage between the linear actuator and spindle as they are generally not aligned with a common, collinear axis of rotation and center of mass. This reduces the stiffness of the drilling apparatus and places the linear actuator and spindle at different locations subject to different temperatures. These different temperatures cause thermal expansion problems which are seen in the position of the drill bit tip. It is to be noted that the term spindle refers to a motor having a rotational shaft extending therefrom that has been modified to accept and hold a machine tool (such as a drill bit) generally by the attachment of a collet or similar device that "chucks" the machine tool. In the present invention the spindle has an electric motor that is capable of rotating at very high speeds (in excess of 250,000 rpm) and utilizes air bearings to accomplish this.

Commercial PCB drilling systems differ in how they position their z-axis (vertical) drilling apparatus over the PCB substrate, however all of the z-axis drilling apparatus operate in a similar function. After the linear scales have determined that the z-axis drilling apparatus has been precisely positioned over the substrate (within the allowable tolerances), a pressure foot secures the substrate to the table beneath and affix the relative position of the substrate with respect to the drilling apparatus. Then a drill bit, rotationally secured in the collet of a drill spindle revolving at a high speed (approximately 250,000 rpm), is rapidly plunged into the substrate to drill an orifice. This is accomplished through the use of a electromagnet's linear traveling voice coil that is coupled to the spindle, and adapted to plunge in the z-axis relative to the fixed magnet portion of the electromagnet which is secured to the frame (mounting plate) of the drilling apparatus. The pressure foot has a set of z-axis guides as does the liner actuator and the spindle that ensures their precise placement. The use of three separate guides is a source of unnecessary mass and of positional inaccuracies. They introduce bending moments that add deflection in the positioning. It also decreases the stiffness of the drilling assembly. The present invention integrates the pressure foot guide, the linear actuator guide and the spindle guide into a light mass, unitary guide system for z-axis travel. It also places the center of the axis of rotation of the spindle collinear with the center of mass for the linear actuator and all components on the drilling assembly that move in the z-axis (also expressed as being concentric or coaxial.)

Figure 2:
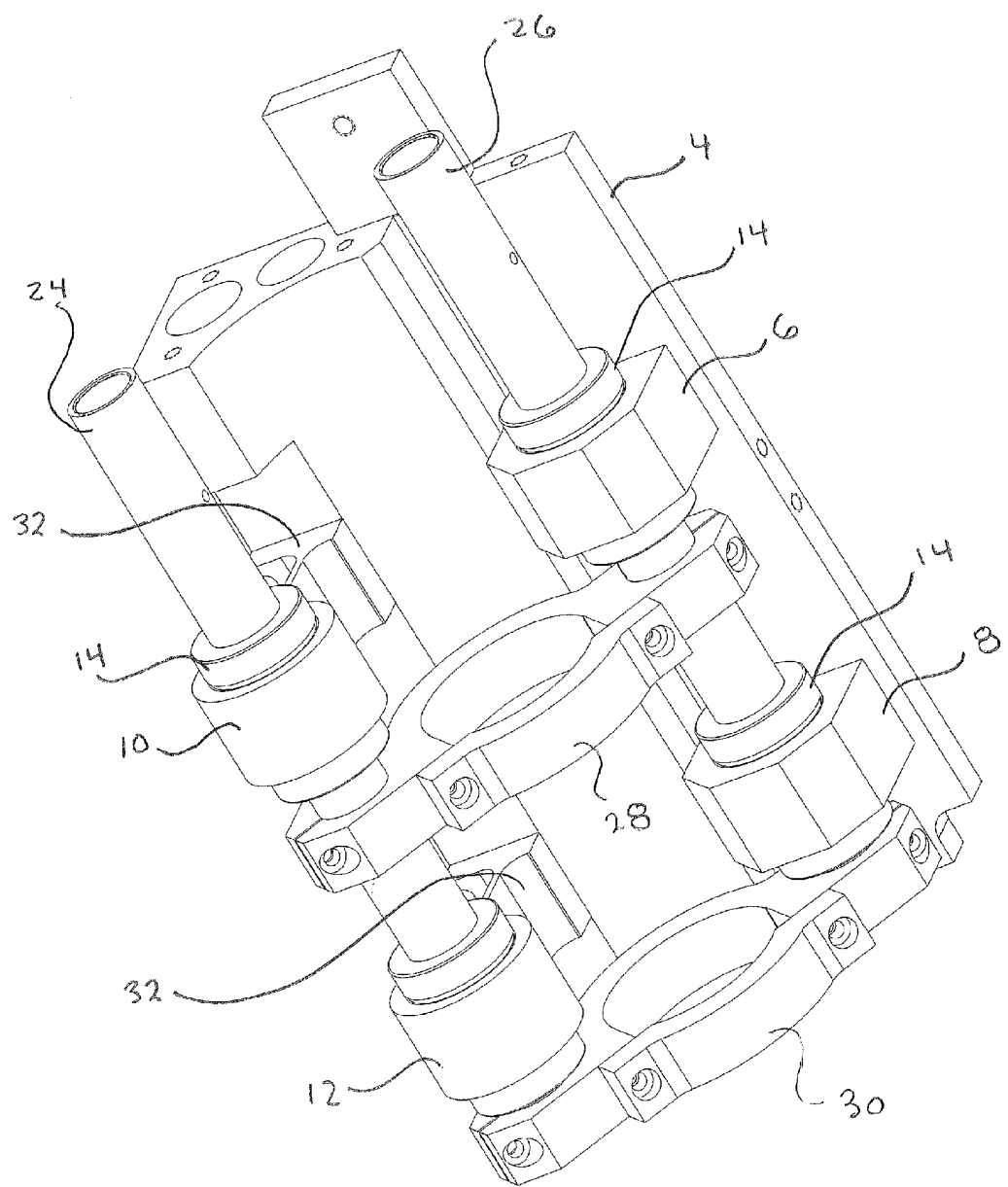
FIG. 2 is a top front perspective view of the z-axis drilling apparatus showing the spindle clamps.
Figure 3:
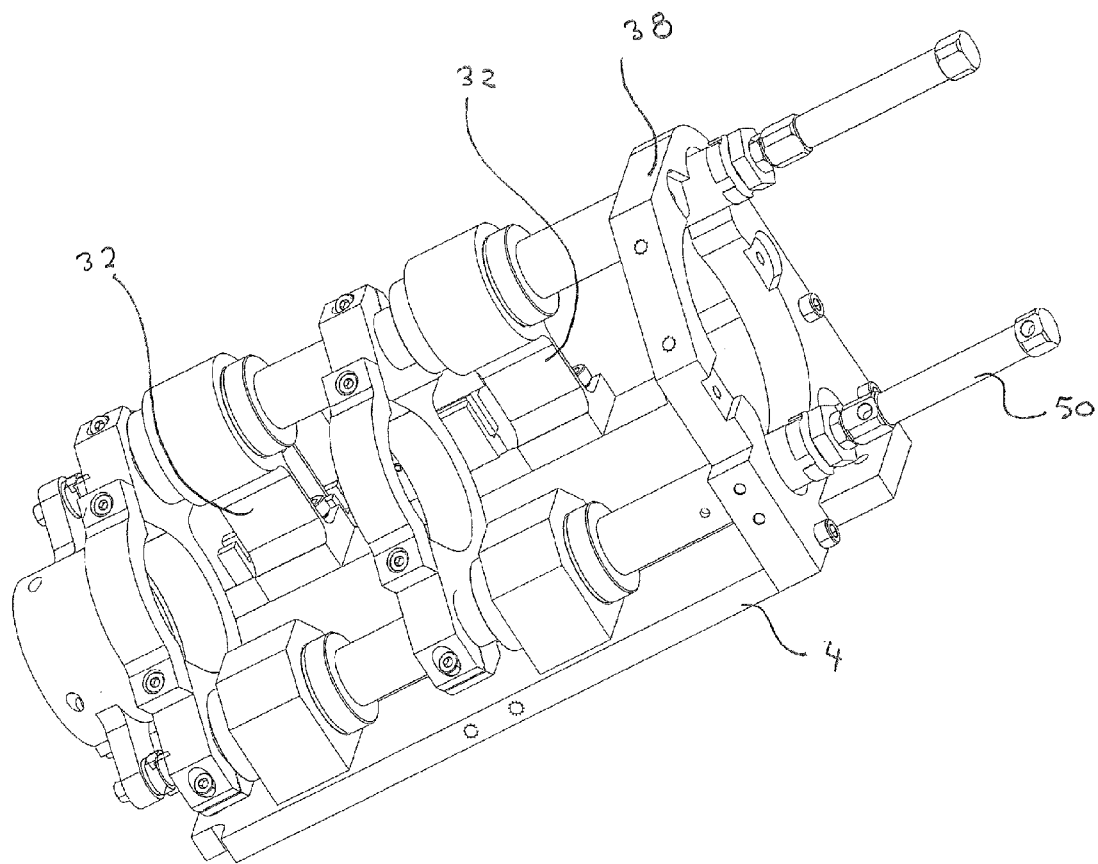
FIG. 3 is a front perspective view of the z-axis drilling apparatus showing the linear actuator clamp.

Looking at FIGS. 1-3 it can be seen that the drilling apparatus 2 has a z-axis mounting plate 4 that houses all the components and adjustably mounts via mechanical fasteners to the moveable x-axis carriage of a PCB drilling system. On the z-axis mounting plate 4 are adjustably mounted, four linear bearing mounts. These are arranged in two identical sets, one right upper and lower bearing mount 6 and 8, and one left upper and lower bearing mounts 10 and 12. Each of these mounts houses an identical linear bearing 14 that is mechanically or chemically affixed therein. The right bearing mounts 6 and 8 are directed affixed to the z-axis mounting plate 4 while the left bearing mounts 10 and 12 are attached to the z-axis mounting plate 4 with rigid standoffs/spacers (flexures) 32 to compensate for thermal expansion. This also allows the linear actuator and spindle to reside at 45 degrees with respect to the carriage for ease of maintenance. The bearing mounts and their bearings form the right upper and lower guide rod bearing assemblies 16 and 18, and the left upper and lower guide rod bearing assemblies 20 and 22.

Through the center of the right upper and lower guide rod bearing assemblies 16 and 18, and the left upper and lower guide rod bearing assemblies 20 and 22, reside the left and right hollow linear actuator and spindle guide rods 24 and 26. A pair of identically matched upper and lower spindle clamps 28 and 30 are affixed between the spindle guide rods 24 and 26. (The spindle guide rods are maintained parallel by the four points of contact from the spindle clamps. During assembly, the linear bearing mounts 6, 8, 10 and 12 are adjustably positioned for rigid mounting on the z-axis mounting plate 4 by the spacing set by the spindle clamps.)

Figure 4:
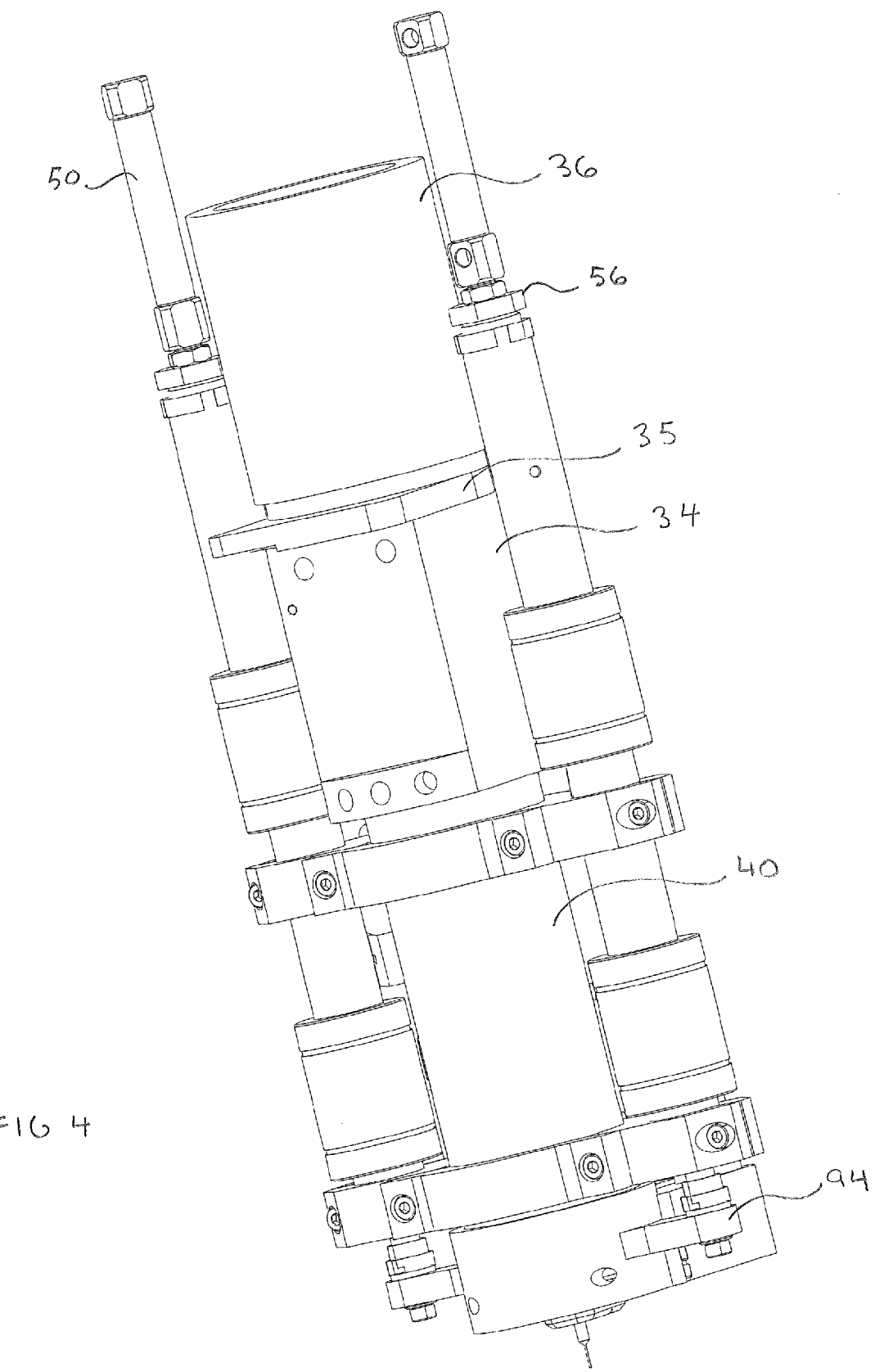
FIG. 4 is a front perspective view of the z-axis drilling apparatus without the bearing mounts and cradle.
Figure 5:
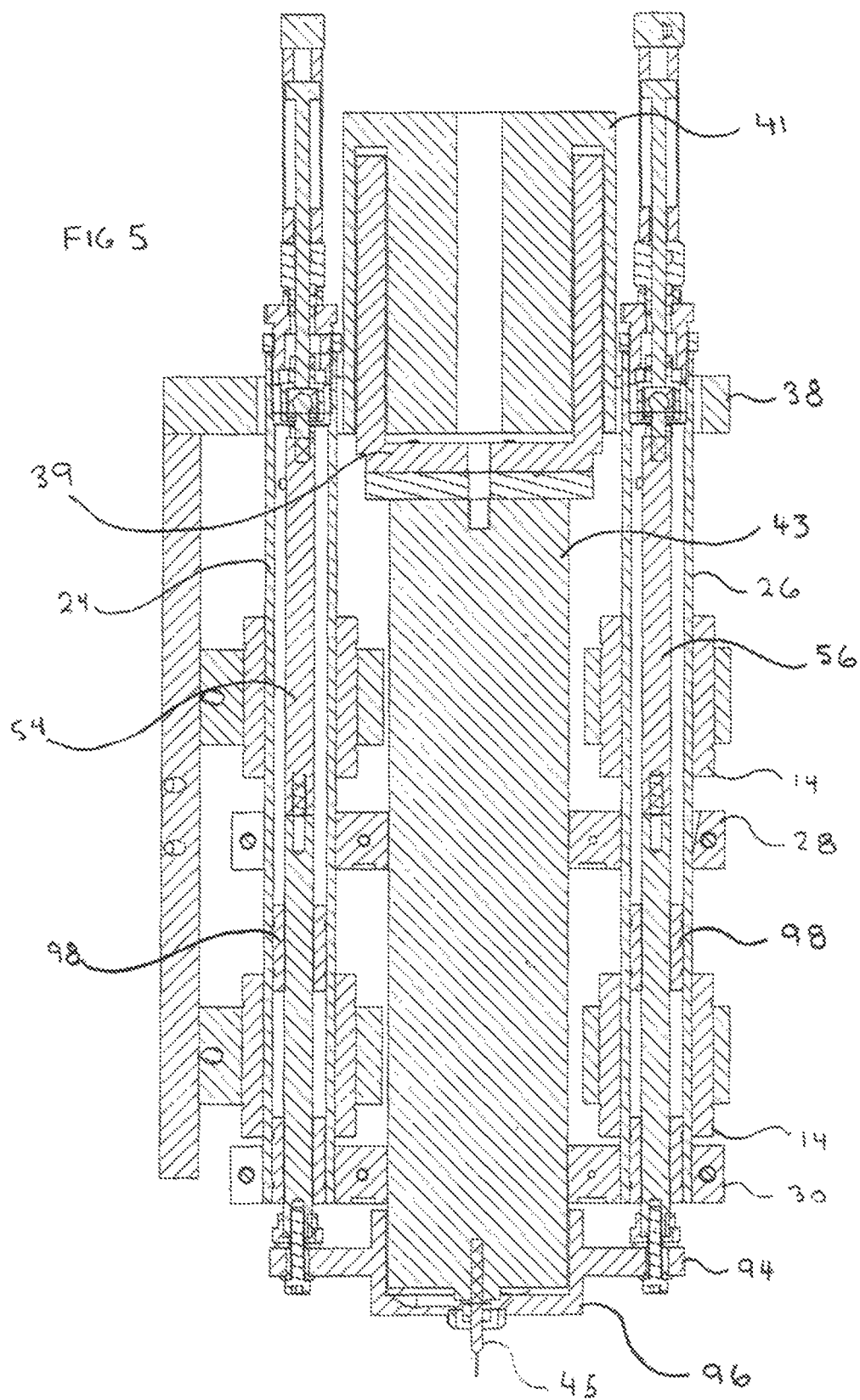
FIG. 5 is a side cross sectional view of the z-axis drilling apparatus showing the general arrangement of all components.

The motor in the spindle 43 commonly used in the industry is an electric motor using air bearings such that it is capable of rotating speeds in excess of 250,000 RPM. Looking at FIGS. 4 and 5 it can be seen that the bottom end of the linear actuator 36 is directly coupled to a plate portion 35 of the spindle rear cover 34 which is connected to the top of the spindle body 40 (the exterior casing of the spindle). The spindle rear cover 34 contains all the spindle interconnections for the utilities of power, water and air and allows them to exit from the side rather than the rear of the spindle. The bottom end of the linear actuator 36 is the moving portion, which is a travelling voice coil surrounding the fixed electromagnet portion of this linear actuator, and is connected to the top of the spindle rear cover 34. Thus, the linear actuator 36 is affixed to and resides directly atop the spindle rear cover 34 such that the center of mass of the linear actuator 36 is collinear with the center of mass and axis of rotation of the spindle 43. (Stated differently, the axis of rotation of the spindle and the center of mass of the spindle, align with the center of mass of the linear actuator so as to form an axis that passes through the center of the spindle 43 and the center of the drill bit. This is also the z-axis.) The housing and fixed magnet portion 41 of the linear actuator 36 is rigidly held in the z-axis mounting plate (also called cradle or housing) 4 by electromagnet mount 38. In this manner, when an electric current is sent to the linear actuator 36, the travelling voice coil 39 plunges the rotating spindle 43 downward in the z-axis. It is to be noted that the electromagnet mount 38 has cutout portions through which the spindle guide rods 24 and 26 pass.

The rotational spindle is adapted to hold a collet that has the ability to "chuck" or secure a drill bit 45 or tool bit for high speed rotation and may interface with a commercial tool indexing unit for the fast efficient changing of drill bits 45 as is well known in the industry.

The upper and lower spindle clamps 28 and 30 when assembled have three bores. There are two identical bores at the clamp's respective ends to allow for rigid attachment to each of the parallel spindle guide rods 24 and 26. The third bore is centrally located and sized for clamping engagement about the outer diameter of the spindle body 40. The spindle clamps are tightened through the use of threaded fasteners drawing together the various portions of the clamps as would be well known in the industry. When the spindle clamps 28 and 30 are affixed to the spindle body 40 and the spindle guide rods 24 and 26, all four of these components are free to be driven downward in the z-axis (through guided, sliding engagement with the linear bearings 14 in the guide rod bearing assemblies 16, 18, 20 and 22 by movement of the travelling voice coil portion 39 of the linear actuator 36. The linear bearings 14 were selected to ensure that the capacity of stroke length of movement in the z-axis exceeds the possible stroke of movement by the traveling voice coil and the attached guide rods 24 and 26.

A coiled linear spring 48 (FIG. 1) is fastened at one of its ends to the electromagnet mount 38 and at its other end to the upper spindle clamp 28 to help return the guide rods 24 and 26 to their upper, refracted position and to ensure that in the event of a power loss the spindle body 40 does not fall out of the drilling assembly 2.

Figure 8:
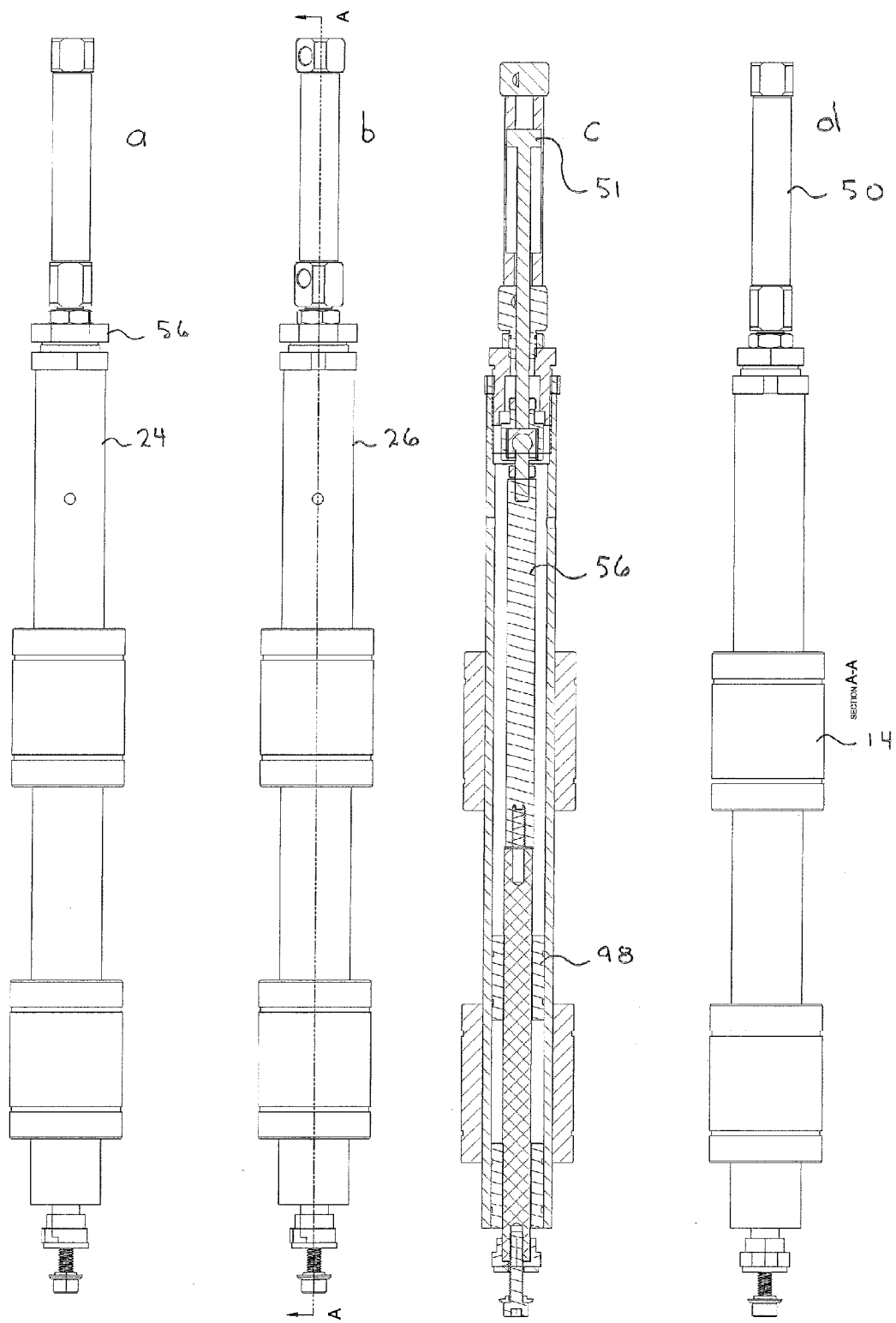
FIGS. 8a-d are views of the guide rod assembly without the pressure foot attached.

A pressure foot actuation system exists to drive down in the z-axis, a pressure foot 96 that surrounds the bottom end of the spindle body 40. Looking at FIGS. 8 and 9 it can be seen that nestled and affixed within each of the hollow guide rods 24 and 26 is a pushrod linear bearing 98 that allows the sliding engagement of left and right pressure foot pushrods 54 and 56 that pass through these bearings' centers. The pushrods 54 and 56 extend through the center of the hollow guide rods 24 and 26 such that the liner axes of the pushrods 54 and 56 lie collinear with the linear axes of the guide rods 24 and 26. (See dotted linear axis labeled A-A on FIGS. 8b and 9b.) The pressure foot pushrods 54 and 56 are each adjustably affixed to movable pistons 51 within pneumatic cylinders 50 that are height adjustably mounted on the top of the hollow guide rods 24 and 26. Threaded mechanical engagement exists between the threaded inner top end of the hollow guide rods 24 and 26 and the pneumatic cylinders. Thus, the length that a pressure foot pushrod can extend beyond the bottom end of the guide rods 24 and 26 can be set with a jam nut assembly 56 between the pneumatic cylinders 50 and the guide rods 24 and 26 as is commonly utilized in the industry. When air is simultaneously admitted to the pneumatic cylinders 50, the pistons 51 drive the pushrods 56 and 54 downward. This allows the pressure foot 96 to extend below the drill bit 45 and be the first point of contact for the plunging spindle body 40. Upon contact, the pressure foot 96 clamps the substrate and acts like a pneumatic spring as the spindle body 40 continues its descent to plunge drill the substrate. The pressure foot actuation system incorporates the pneumatic cylinders 50 and the pushrods 56 and 54 as well as the associated mechanical linkage. The linear axis of the pressure foot actuation system resides collinear (also expressed as being concentric or coaxial) with the linear axis of the guide rods 24 and 26.

There is a generally circular pressure foot clamp 94, that similar to the spindle clamps, also has three bores. There are two identical bores at the clamp's respective ends (also called extending ears) to allow for rigid attachment to each of the pressure foot pushrods 54 and 56. The third bore is centrally located and sized for clamping engagement about the pressure foot 96. The pressure foot clamp 94 is tightened through the use of threaded fasteners drawing together the various portions of the clamp as would be well known in the industry. When the pressure foot clamp 94 is affixed to the bottom end of the pressure foot pushrods 54 and 56, these components (pressure foot pushrods, pressure foot clamp and pressure foot) are free to be driven downward in the z-axis through guided, sliding engagement through the pushrod linear bearings 98 housed in the hollow guide rods 24 and 26. Like the linear bearings 14, the pushrod linear bearings 98 were selected to ensure that their capacity of movement in the z-axis exceeded the possible travel of the piston and attached pushrods 52 and 54. It is to be noted that the pressure foot 96 can be retracted for tool changes by reversing the direction of the pressure in the dual action pneumatic cylinders 50.

The z-axis movement of the pressure foot 96 is independent of the z-axis movement of the spindle body 40, however they each are individually and independently positionally guided by a unitary guide system that has two hollow motor and spindle guide rods 24 and 26 positioned at 180 degrees apart about the linear axis of the spindle body 40. These guide the linear actuator 36 and spindle body 40 positioning on their outside surfaces, and slidingly house two pressure foot pushrods 54 and 56 through their center that guide the pressure foot positioning.

Figure 6:
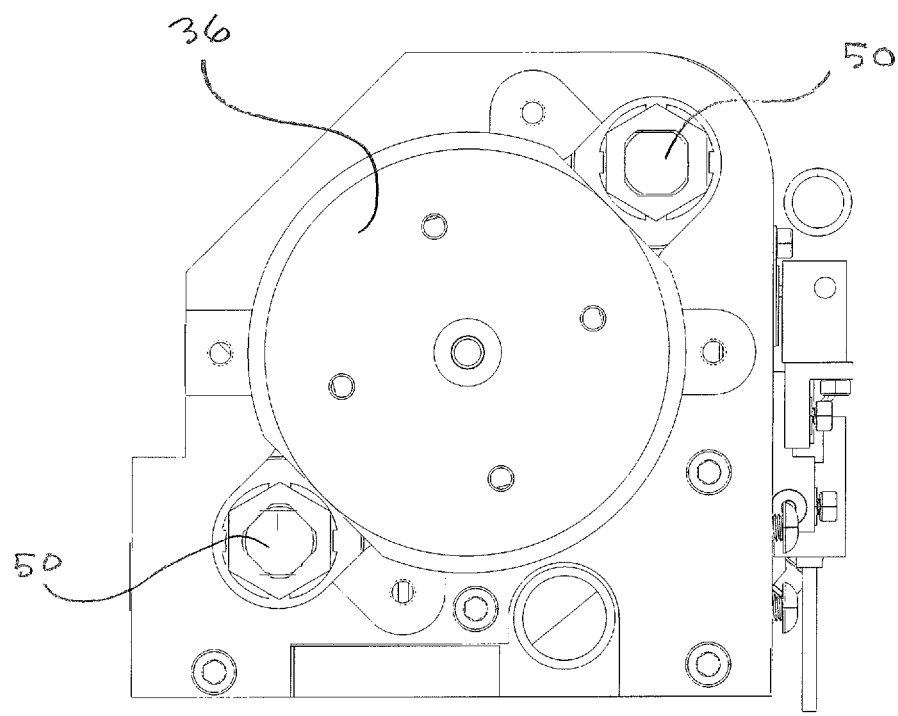
FIG. 6 is a top view of the z-axis drilling apparatus.
Figure 7:
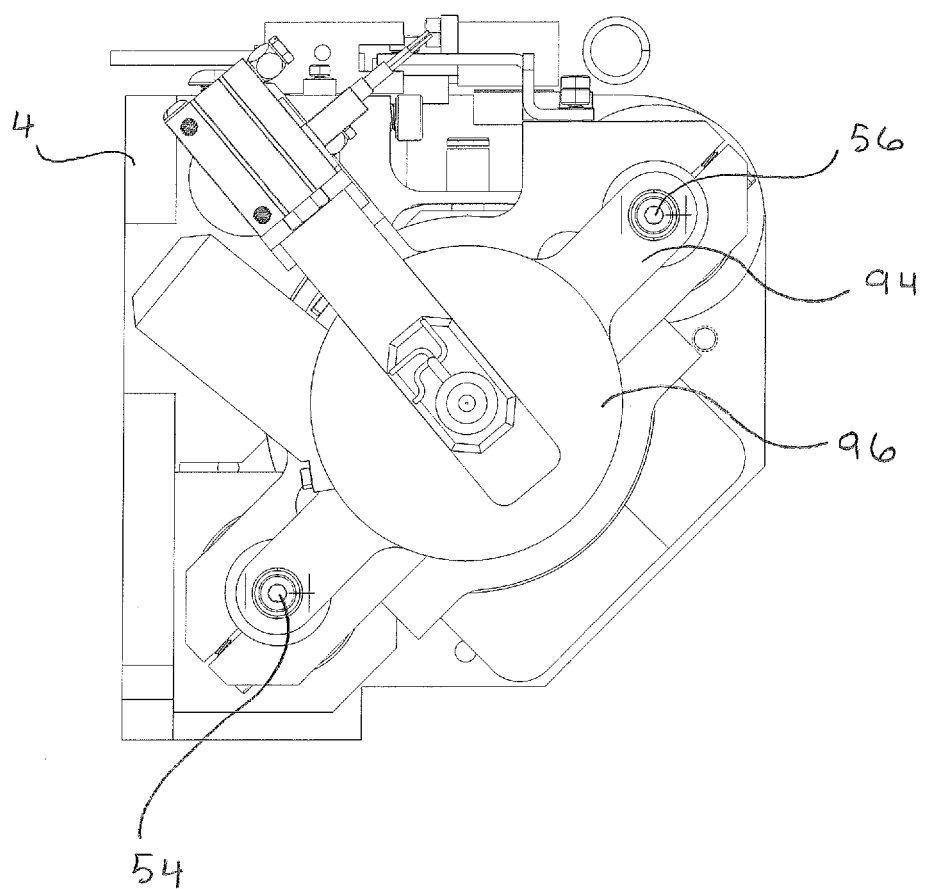
FIG. 7 is a bottom view of the z-axis drilling apparatus.

FIGS. 6 and 7 show the z-axis drill assembly 2 from a top and bottom view and further clarify the pressure foot design and the orientation of the linear actuator 36, spindle 41 and the guide rods 24 and 26 in the z-axis mounting plate (cradle.)

In the preferred embodiment the overall weight of the components that move in z-axis is approximately 4.5 kilograms with individual component weights as follows:
Spindle: 2200 gms
Internal shaft and top cylinder: 2@160 gms=320 gms
Main shafts: 2@260 gms=520 gms
Spindle clamps: 2@220 gms=440 gms
Pressure foot: 185 gms
Voice Coil: 730 gms
Total: 4,395 grams.

It is to be noted that PCB drilling systems generally have a natural frequency of approximately 40 Hz to 80 Hz. With the design improvements detailed above, there is an increase in stiffness and dynamic balancing of the drilling apparatus such that its operational frequency can be raised to over 150 Hz. By raising the natural frequency of the system above the operational frequency of the system there is less movement, quicker settling and more precise positioning.

Having thus described the invention, what is claimed as new and desired to be secured by Letters Patent is as follows:

1. A drilling assembly comprising:
    a mounting plate;
    a rotational spindle housed in a rotationally fixed spindle body;
    a linear actuator affixed to said mounting plate and said rotational spindle wherein said linear actuator has a fixed magnet portion rigidly affixed to said mounting plate by a linear actuator clamp, and a moveable, traveling voice coil portion, said travelling voice coil portion affixed to said spindle;
    at least one moveable spindle guide rod;
    a set of bearing mounts rigidly affixed to said mounting plate and supporting at least one slideably mounted spindle guide rod;
    a moveable pressure foot attached to and residing about a bottom of said spindle; and
    at least one spindle clamp mounted on an exterior surface of said at least one spindle guide rod and rigidly mounted to said spindle body.

2. The drilling assembly of claim 1 wherein said linear actuator has a center of mass, and said spindle has an axis of rotation, and wherein said center of mass and said axis of rotation all reside collinear.

3. The drilling assembly of claim 2 wherein the number of bearing mounts is four.

4. The drilling assembly of claim 3 wherein the number of spindle clamps is two.

5. The drilling assembly of claim 2 wherein said spindle guide rods are hollow tubes.

6. The drilling assembly of claim 5 further comprising at least one pressure foot pushrod that is slidingly housed inside each of said spindle guide rods and that is connected at a first end to said pressure foot.

7. The drilling assembly of claim 5 wherein said spindle guide rods reside parallel to each other and at 180 degrees apart about the spindle axis of rotation.

8. The drilling assembly of claim 7 wherein each spindle guide rod rigidly houses a linear bearing that slidingly supports said pressure foot pushrod.

9. The drilling assembly of claim 8 further comprising a pneumatic cylinder adjustably affixed to a top end of said spindle guide rod, said pneumatic cylinder having a moveable shaft extending therefrom.

10. The drilling assembly of claim 9 wherein a second end of said pressure foot pushrod is affixed to said moveable shaft.

11. The drilling assembly of claim 9 wherein said pressure foot pushrod has a linear axis that is collinear with a linear axis of said spindle guide rod such that said axes are concentric.

12. The drilling assembly of claim 1 wherein the number of spindle guide rod is two.

13. The drilling assembly of claim 1 wherein said bearing mounts each house a linear bearing that allows the sliding contact of said guide posts therein.

14. A drilling assembly comprising:
    a mounting plate;
    a linear actuator having a fixed magnet portion rigidly affixed to said mounting plate and a moveable, traveling voice coil portion;
    a rotational spindle, housed in a rotationally fixed spindle body, affixed to said traveling voice coil portion;
    a moveable pressure foot residing about a bottom of said spindle;
    at least one spindle guide rod;
    a set of bearing mounts rigidly affixed to said mounting plate and supporting at least one slideably mounted tubular spindle guide rod;
    at least one pressure foot actuating system mounted on said spindle guide rod and connected to said pressure foot, and having a linear axis that resides coaxial with a linear axis of the guide rods; and
    at least one spindle clamp mounted on an exterior surface of said at least one spindle guide rod and rigidly mounted to said spindle body.

15. The drilling assembly of claim 14 wherein said linear actuator has a center of mass and said spindle has an axis of rotation, and wherein said center of mass and said axis of rotation all reside coaxial.

16. The drilling assembly of claim 14 wherein
    the number of spindle guide rods is two;
    the number of bearing mounts is four;
    the number of spindle clamps is two; and
    the number of pressure foot actuating systems is two.

* * * * *